(12) United States Patent
Lin et al.

(10) Patent No.: US 8,453,318 B2
(45) Date of Patent: Jun. 4, 2013

(54) METHOD FOR MAKING A PLANAR COIL

(71) Applicant: Touch Micro-System Technology Corp., Taoyuan (TW)

(72) Inventors: Hung Yi Lin, Taoyuan (TW); Ming Fa Chen, Taoyuan (TW)

(73) Assignee: Touch Micro-System Technology Corp., Taoyuan County (TW)

( * ) Notice: Subject to any disclaimer, the term of this patent is extended or adjusted under 35 U.S.C. 154(b) by 0 days.

(21) Appl. No.: 13/651,771

(22) Filed: Oct. 15, 2012

(65) Prior Publication Data

US 2013/0043136 A1     Feb. 21, 2013

Related U.S. Application Data

(62) Division of application No. 12/899,836, filed on Oct. 7, 2010, now Pat. No. 8,310,328.

(51) Int. Cl.
*H01F 7/06* (2006.01)

(52) U.S. Cl.
USPC ............... 29/606; 29/604; 29/605; 29/841; 336/176; 336/200; 336/229; 438/238; 438/381; 438/430; 438/788

(58) Field of Classification Search
USPC ............... 29/602.1, 604, 605, 606, 829, 855, 29/841, 852, 858; 336/176, 200, 229; 438/238, 438/381, 430, 788, 792
See application file for complete search history.

(56) References Cited

U.S. PATENT DOCUMENTS

| | | | |
|---|---|---|---|
| 6,720,248 B2 * | 4/2004 | Ryo | 438/622 |
| 7,425,506 B1 * | 9/2008 | Kailasam | 438/694 |

* cited by examiner

*Primary Examiner* — Paul D Kim
(74) *Attorney, Agent, or Firm* — Bacon & Thomas, PLLC

(57) ABSTRACT

A method of making a planar coil is disclosed in the present invention. First, a substrate having a trench is provided. Then, a barrier and a seed layer are formed on the substrate in sequence. An isolative layer is used for guiding a conductive material to flow into a lower portion of the trench such that accumulation of the conductive material at opening of the trench is prevented before the lower portion of the trench is completely filled up, thereby avoiding gap formation in the trench.

13 Claims, 12 Drawing Sheets

METHOD FOR MAKING A PLANAR COIL

CROSS REFERENCE TO RELATED APPLICATIONS

The present application is a Divisional application of U.S. patent application Ser. No. 12/899,836, filed on Oct. 7, 2010, now U.S. Pat. No. 8,310,328.

FIELD OF THE INVENTION

The present invention relates to a method for making a planar coil. More particularly, the present invention relates to a method for making a planar coil by micro-electro-mechanical system (MEMS) processes.

BACKGROUND OF THE INVENTION

The technology combining micromachining and integrated circuit processes becomes mature. Thus, for many micro-electro-mechanical system (MEMS) devices, microactuators are used to provide driving force and play a key part in operation. So far, electromagnetic microactuators are the main stream because the making processes are quite simple. In general, the electromagnetic microactuators are composed of a magnet and a planar coil. The planar coil can be obtained by integrated circuit processes.

The planar coil is applied to many MEMS devices. A planar coil can be used with a permanent magnet to drive micro pumps, micro valves, micro relays or other elements. Manufacture of planar coils is very important in such a field.

Please refer to FIGS. 1(A) to 1(E). A conventional method for making a planar coil is shown. A substrate 1 is provided, as shown in FIG. 1(A). Then a number of trenches 2 are formed by reactive-ion etching, as shown in FIG. 1(B). The trench 2 has a trapezoidal cross section. A barrier 3 is formed on the substrate 1. Later, a seed layer 4 is formed on the barrier 3, as shown in FIG. 1(C). Next, copper is electroplated onto the seed layer 4 until the trench 2 is filled with copper, as shown in FIG. 1(D). Finally, the seed layer 4 on the surface of the substrate 1 is removed. Accordingly, a planar coil is formed.

An obvious defect is that the cross section of the coil is trapezoidal. Usually, gaps are formed in the coil during a cryogenic process or Bosch process while making high aspect ratios of cross section for the planar coil, causing poor electrical properties of the coil. For a planar coil having a trapezoidal cross section, aspect ratio is limited.

Please refer to FIG. 2 and FIG. 3. Another conventional method for making a planar coil is shown. A tooling 11 using a steel-made plate 10 is engraved with many peaks 14 and troughs 15. A hardening layer 13 is formed on a polymer substrate 12 by ultraviolet beams. Then, the hardening layer 13 is pressed by the tooling 11. Due to the peaks 14 and troughs 15, a number of high aspect ratio trenches will be formed on the hardening layer 13. Next, a seed layer 16 of copper is formed by vapor deposition process on the hardening layer 13. A coil layer 17 is electroplated onto the seed layer 16. Finally, after the redundant portion of the coil layer 17 is removed, a planar coil is formed.

The method utilizes the tooling 11 and the hardening layer 13 to provide high aspect ratio trenches for making the planar coil. No matter what additional agent is used to enhance the hardness of tooling 11, the tooling 11 will be worn out after long-term use. A designated shape of the planar coil can not be achieved. In addition, the coil layer 17 will stick to the hardening layer 13 if the hardening layer 13 is not firm enough.

From the description above, a method for making planar coils with good quality is desired. Especially, a method for making planar coils with high aspect ratio is desperately needed.

SUMMARY OF THE INVENTION

This paragraph extracts and compiles some features of the present invention; other features will be disclosed in the follow-up paragraphs. It is intended to cover various modifications and similar arrangements included within the spirit and scope of the appended claims.

In accordance with an aspect of the present invention, a method for making a planar coil, includes the steps of: a) providing a substrate; b) covering a predetermined area of the substrate with a patterned photoresist layer; c) etching the substrate to form a trench at a place outside of the predetermined area; d) removing the photoresist layer; e) applying a barrier on the substrate; f) growing a seed layer on the barrier; g) covering the predetermined area with an isolative layer which extends slightly into the trench; h) filling up the trench with a conductive material by electroplating; and i) removing a portion of the isolative layer and the seed layer located above the predetermined area. The isolative layer guides the conductive material to flow into a lower portion of the trench such that accumulation of the conductive material at opening of the trench is prevented before the lower portion of the trench is completely filled up, thereby avoiding gap formation in the trench.

Preferably, step c) is performed by deep reactive-ion etching (DRIE).

Preferably, step d) is conducted by use of acetone.

Preferably, step i) is conducted by use of buffered oxide etch (BOE) for removing the isolative layer, and hydrogen peroxide, ammonium hydroxide, or an acetic acid based etchant is used for removing the seed layer.

Preferably, the seed layer is formed by sputtering.

Preferably, the substrate is made of silicon.

Preferably, the barrier is electrically insulated.

Preferably, the barrier is made of silicon dioxide.

Preferably, the seed layer is made of copper, titanium, or a mixture thereof.

Preferably, the isolative layer is made of silicon dioxide.

Preferably, step g) is performed by plasma-enhanced chemical vapor deposition (PECVD).

Preferably, the conductive material is copper.

Preferably, the method further includes a step of j) forming a hole through center of the substrate to form a loop-shaped planar coil.

In accordance with another aspect of the present invention, a planar coil includes: a substrate having a trench formed therein; a barrier on the substrate; and a seed layer on the barrier in the trench. The trench is filled up with a conductive material and a slot is formed between the conductive material and a portion of the seed layer near the surface of the planar coil.

Preferably, the slot is filled with an isolative material.

Preferably, the isolative material comprises silicon dioxide.

Preferably, the substrate is made of silicon.

Preferably, the barrier is made of silicon dioxide.

Preferably, the seed layer is made of copper, titanium, or a mixture thereof.

Preferably, the conductive material is copper.

Preferably, the substrate has a hole through the center to form a loop-shaped planar coil.

DETAILED DESCRIPTION OF THE PREFERRED EMBODIMENT

Figure 1:
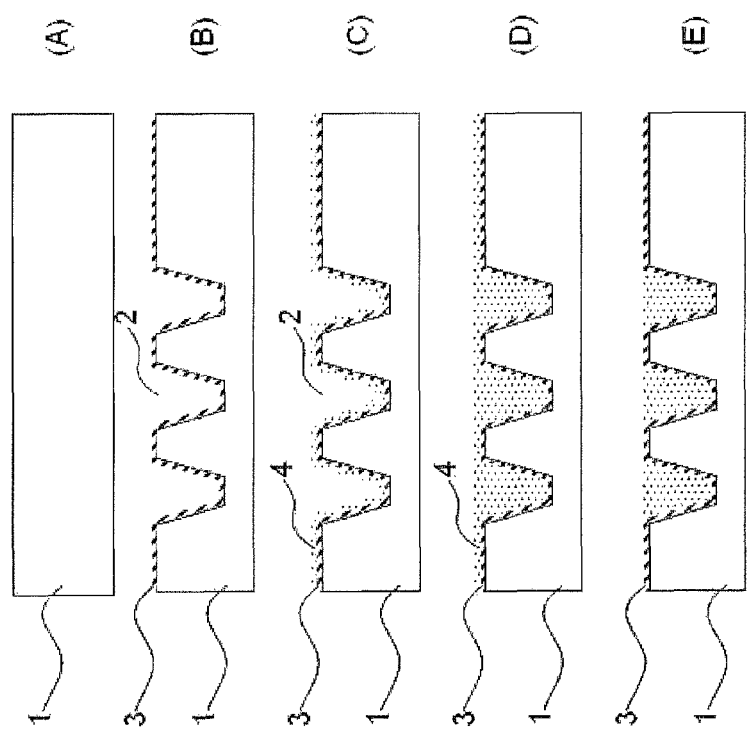
FIGS. 1(A) to 1(E) illustrate a prior art of making a planar coil.
Figure 2:
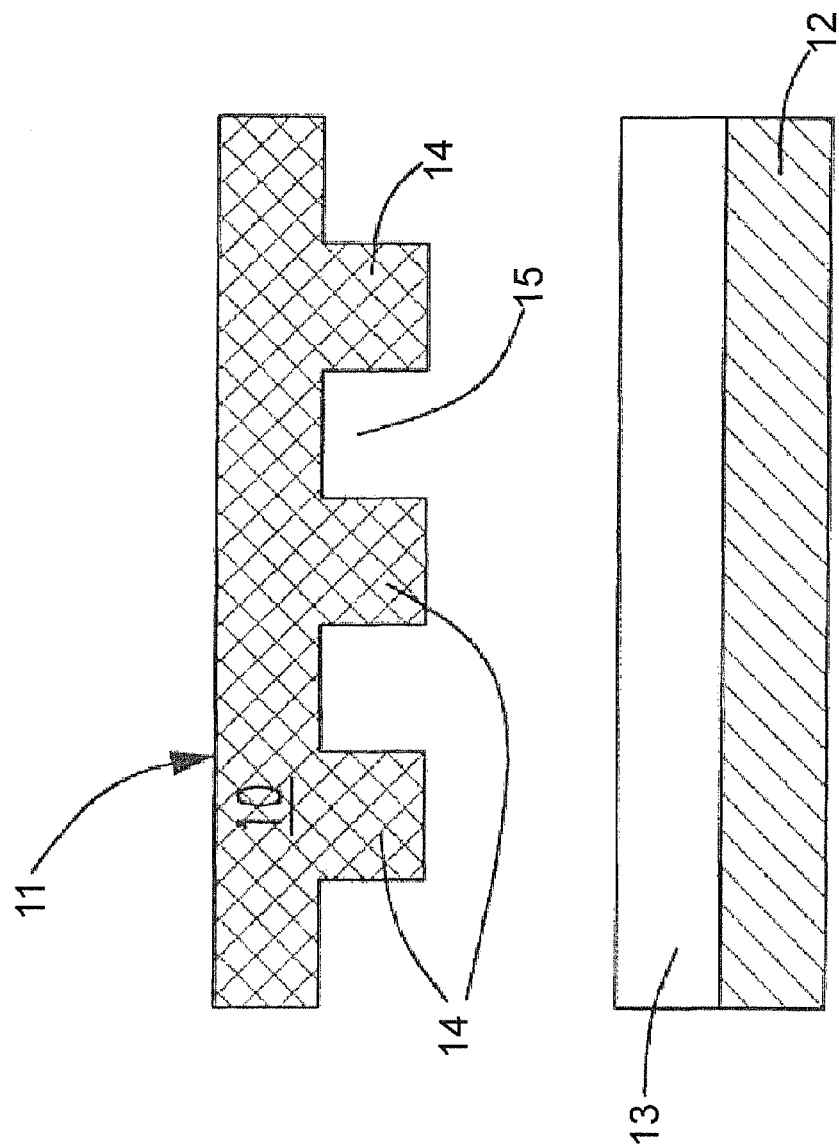
FIGS. 2 and 3 illustrate another prior art of making a planar coil.
Figure 3:
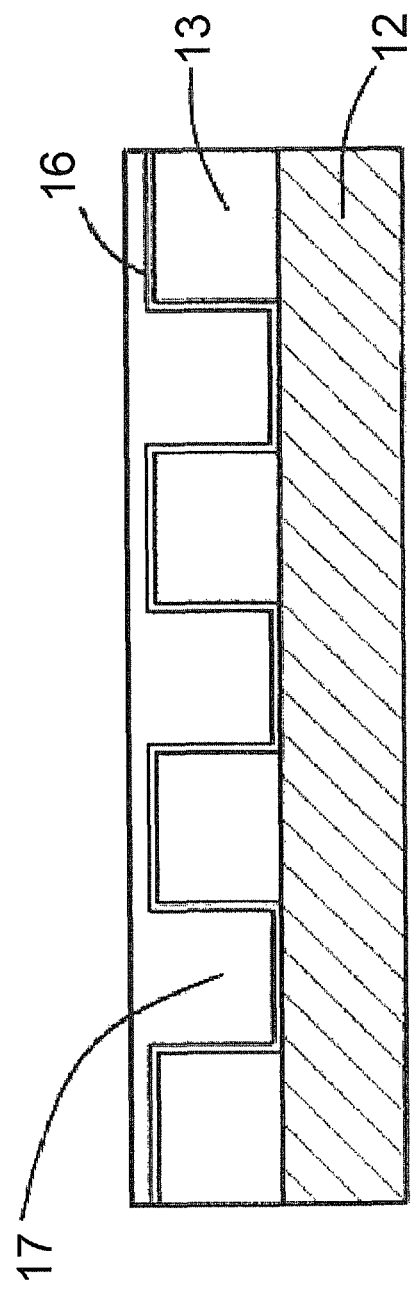
Figure 4:
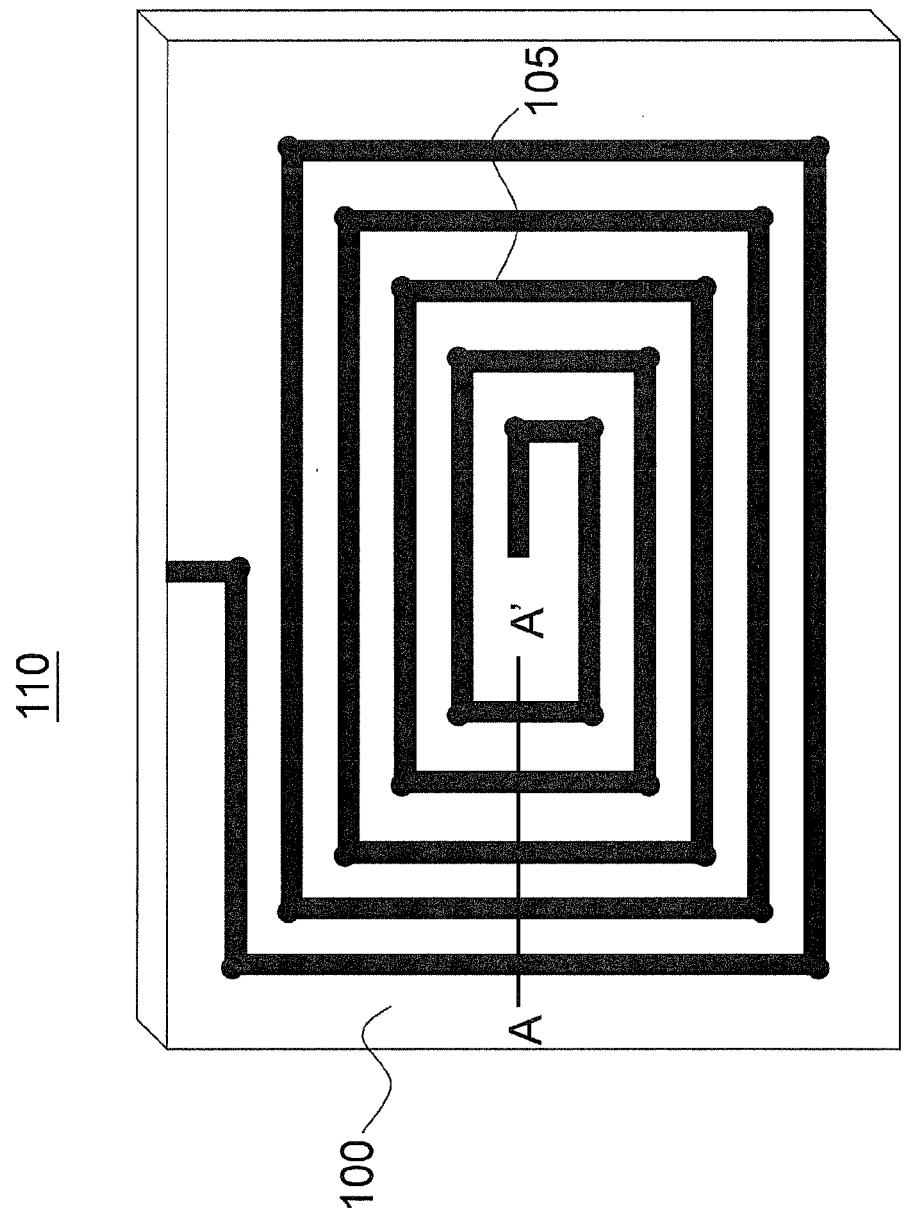
FIG. 4 is a planar coil according to an embodiment of the present invention.

Please refer to FIGS. 4 to 11. An embodiment is described. FIG. 4 is a top view of a planar coil 110. It has a coil body 105 formed on a substrate 100. In this embodiment, the substrate 100 is a silicon substrate. In order to make illustration of the present invention more comprehensive, a cross section is taken along line AA' to depict the steps of the invention.

Figure 5:
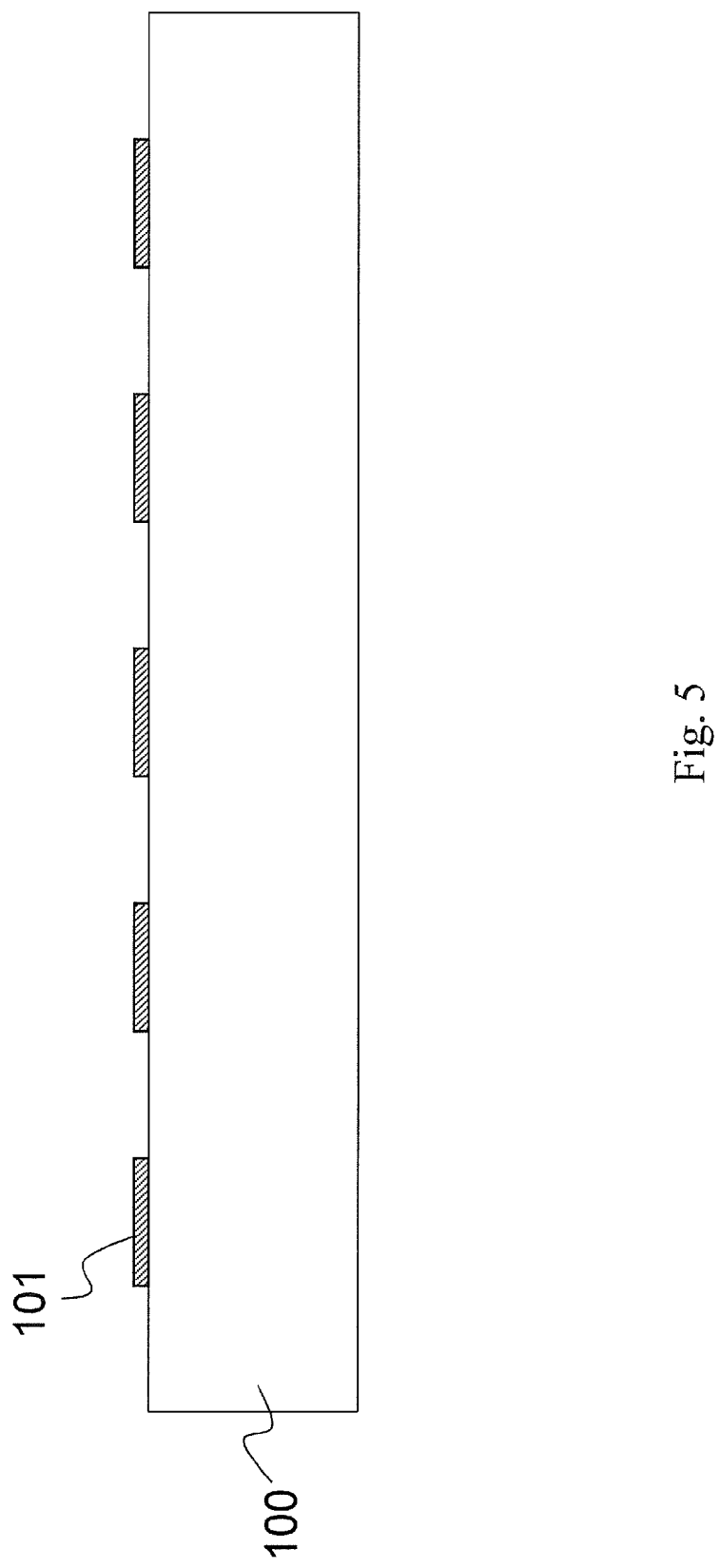
FIG. 5 shows a patterned photoresist layer applied on a substrate.
Figure 6:
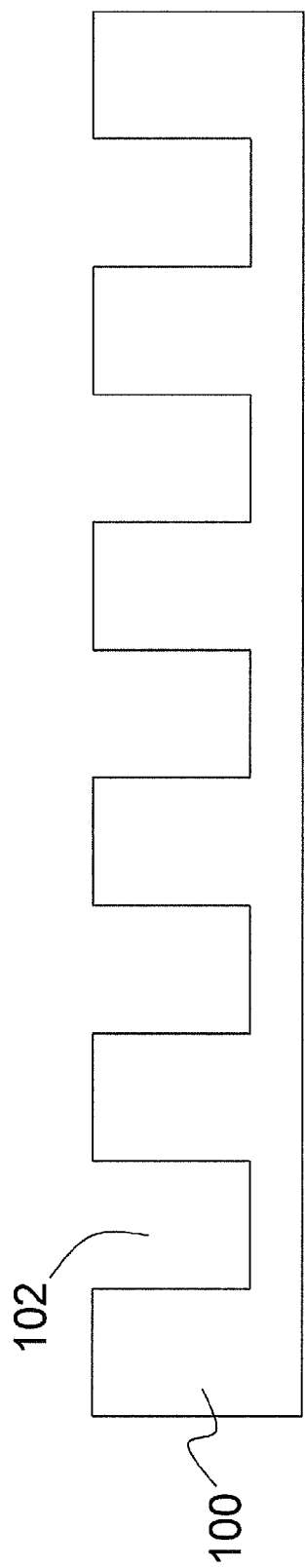
FIG. 6 shows the substrate having a number of trenches formed therein.

Please refer to FIG. 5. In the beginning of making the planar coil 110, a patterned photoresist layer 101 is applied on the substrate 100 covering a predetermined area. Later, a number of trenches 102 are formed by etching the substrate at a place outside of the predetermined area, as shown in FIG. 6. In the present invention, deep reactive-ion etching (DRIE) is used for etching. DRIE is a highly anisotropic etching process used to create deep, steep-sided holes and trenches in wafers, with aspect ratios of 20:1 or more. It was developed for micro electromechanical systems (MEMS) which require these features. There are two main technologies for high-rate DRIE: cryogenic process and Bosch process. Both Bosch and cryogenic processes can fabricate vertical walls, but often the walls are sloped at an angle. By using the DRIE, the walls of the trenches 102 can be substantially vertical. The planar coil 110 can have better electrical properties and smaller size.

Figure 7:
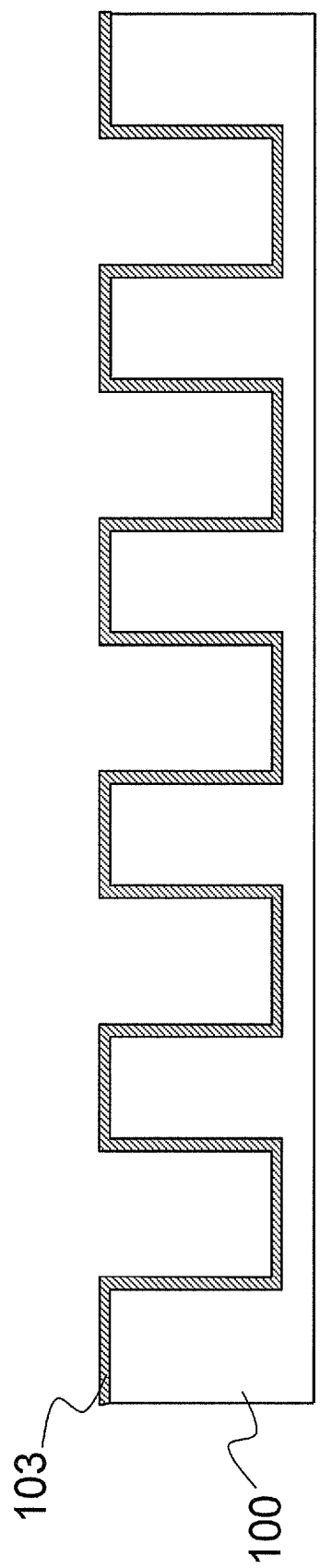
FIG. 7 shows a barrier formed on the substrate.

Then, the patterned photoresist layer 101 is removed. Acetone can be use to wash off the patterned photoresist layer 101. Next, a barrier 103 is formed over the substrate 100, as shown in FIG. 7. The barrier 103 is formed by conducting thermal oxidation to the substrate 100. The barrier 103 is made of silicon dioxide. It provides good electrical insulation for the coil body 105. Although the barrier 103 is formed on the whole substrate 100 in this embodiment, it can be formed only on the predetermined area.

Figure 8:
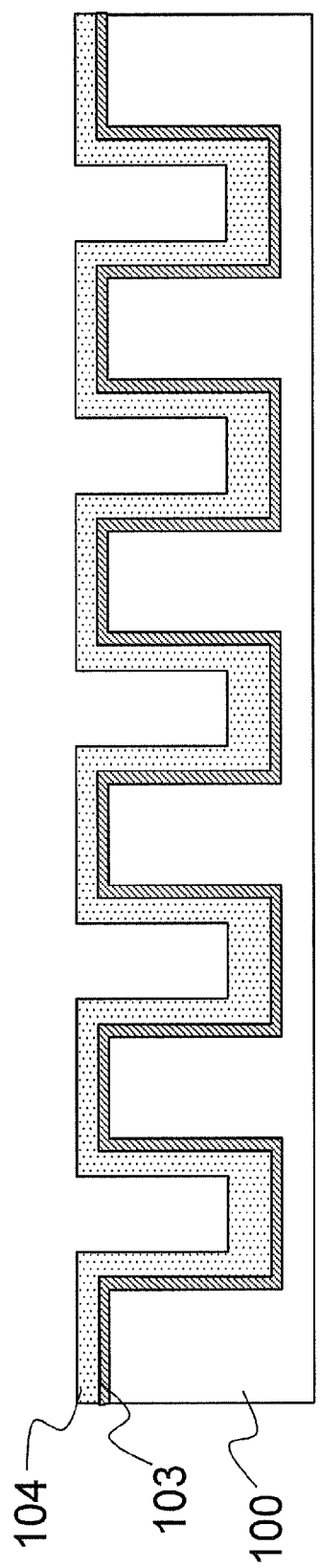
FIG. 8 shows a seed layer formed on the barrier.

Later, please see FIG. 8. A seed layer 104 is formed on the barrier 103. In the present invention, the seed layer 104 is formed by sputtering. The seed layer 104 is made of copper. In practice, it can also be made of titanium or a mixture of copper and titanium. The seed layer 104 is used to facilitate ions in an electroplating process later on mentioned to be attached to the barrier 103.

Figure 9:
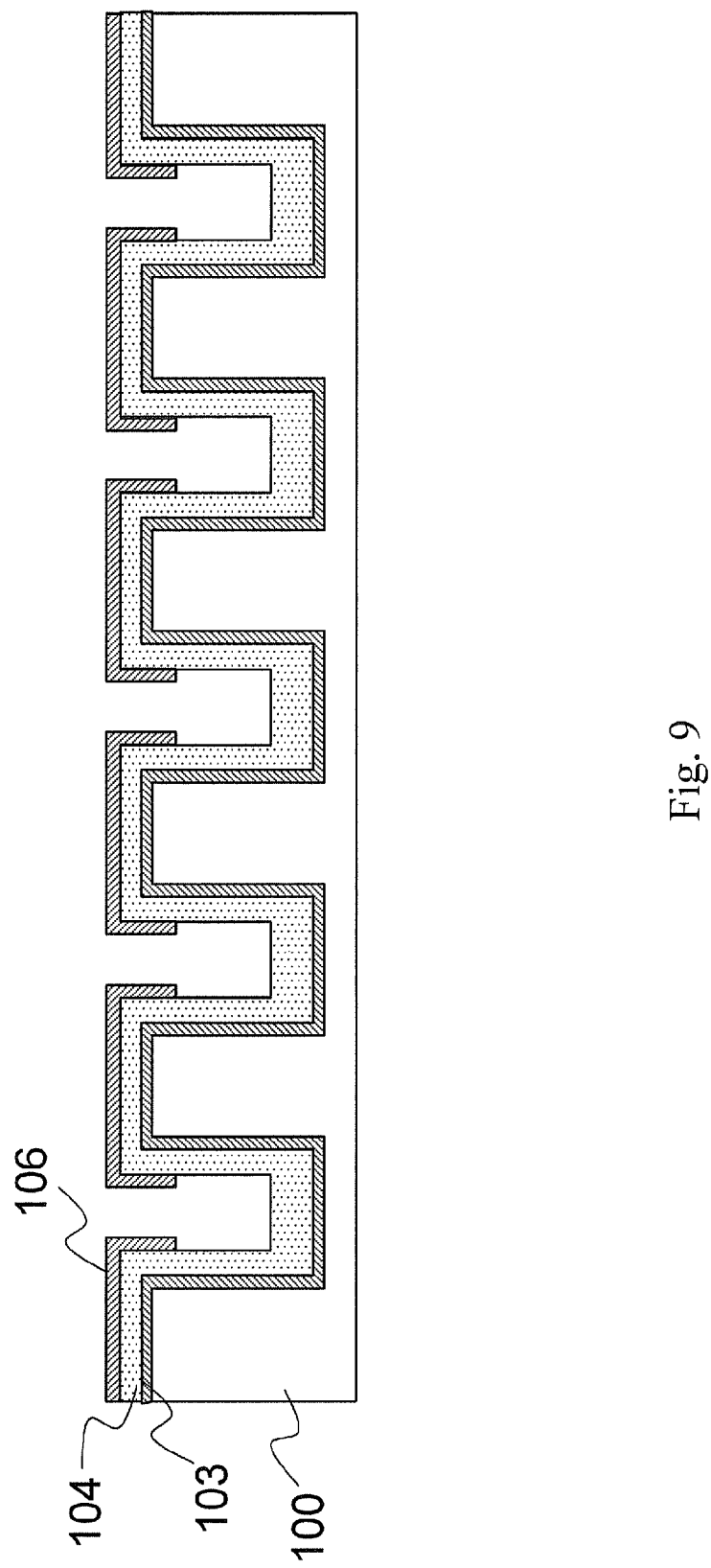
FIG. 9 shows an isolative layer partially applied on the substrate.

FIG. 9 shows an isolative layer 106 formed on the seed layer 104 covering the predetermined area and extending slightly into the trenches 102. The isolative layer 106 is made of silicon dioxide. The isolative layer 106 is used as a lubricant for preventing ions from sticking thereon. Plasma-enhanced chemical vapor deposition (PECVD) is used for forming the isolative layer 106 on the seed layer 104 because PECVD can be performed under low temperature, thereby preventing the seed layer 104 from melting at high temperature.

Figure 10:
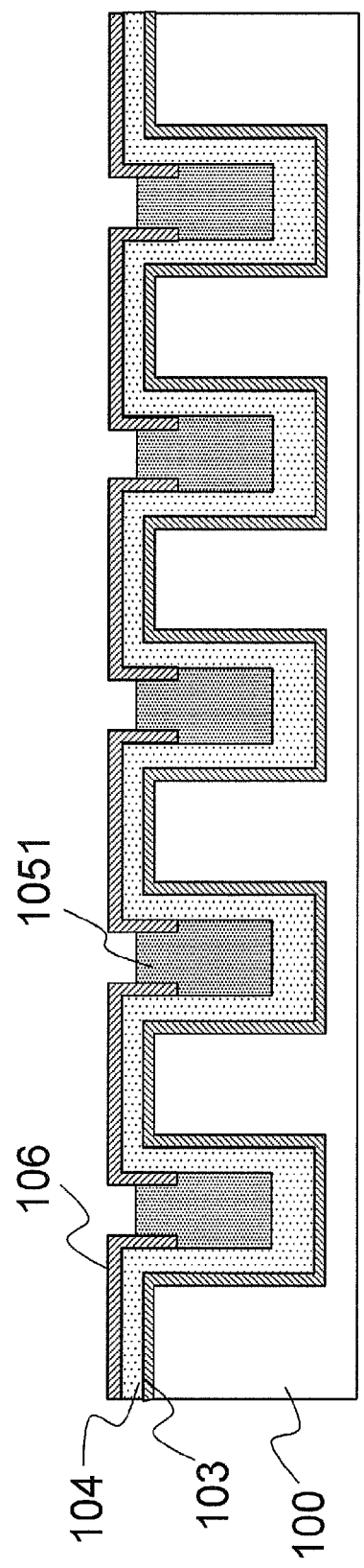
FIG. 10 shows the trenches filled up with a conductive material by electroplating.
Figure 11:
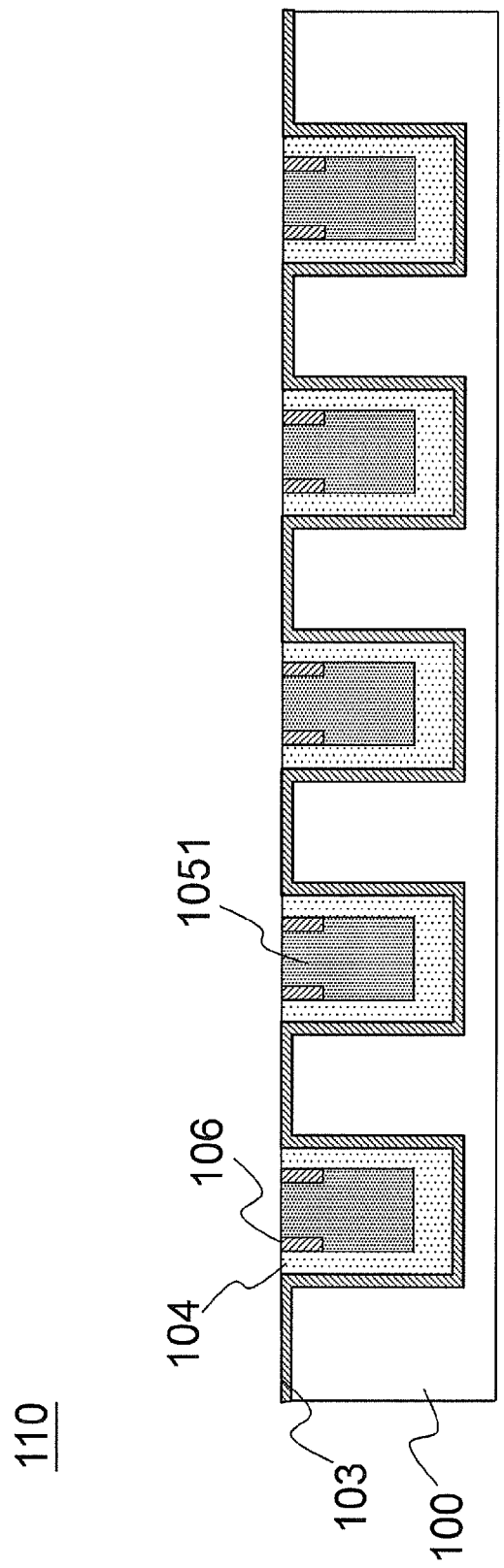
FIG. 11 shows a completed planar coil according to the present invention.

Next, please refer to FIG. 10. The trenches 102 of the substrate 100 are filled up with a conductive material 1051 to form the coil body 105 by electroplating. In the present invention, the conductive material 1051 is copper so that the copper ions can adhere to the seed layer 104. In addition, when the copper ions reaches the isolative layer 106 (PEOX), they will easily slip into the trenches 102. In other words, the isolative layer 106 guides the conductive material 1051 to flow into a lower portion of the trench 102 such that accumulation of the conductive material 1051 at opening of the trench 102 is prevented before the lower portion of the trench 102 is completely filled up, thereby avoiding gap formation in the trench 102.

Figure 12:
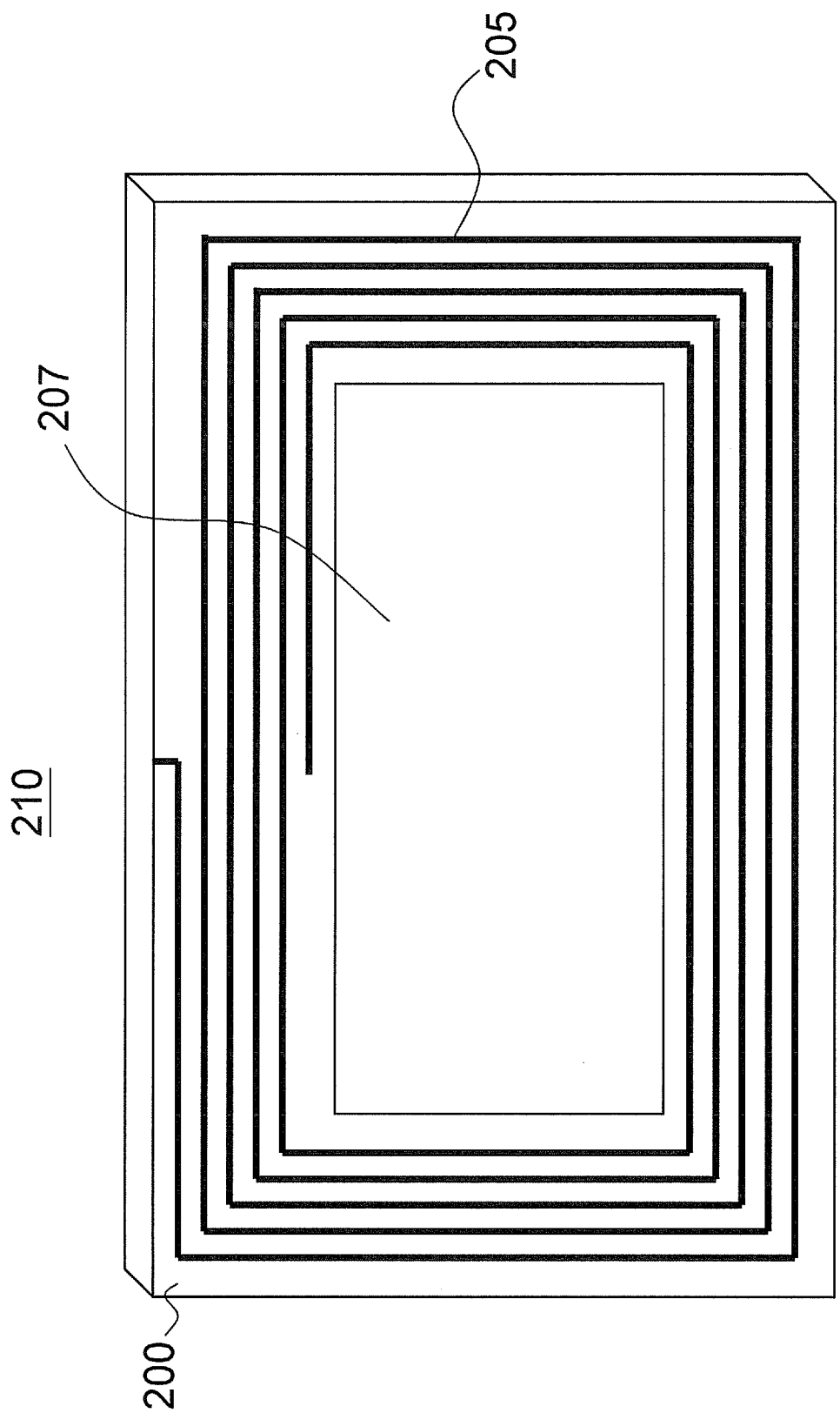
FIG. 12 shows another planar coil according to the present invention.

Please refer to FIG. 12. Finally, a portion of the isolative layer 106 and the seed layer 104 trenches located above the predetermined area are removed. The planar coil 110 is finished. In this step, buffered oxide etch (BOE) for removing the isolative layer, and hydrogen peroxide, ammonium hydroxide, or an acetic acid based etchant is used for removing the seed layer is used for removal.

The aforementioned process for making a planar coil can also be used for making a loop-shaped planar coil 210 by forming a hole 207 through center of a substrate 200 such that a coil body 205 is looped around the hole 207, as shown in FIG. 12.

Furthermore, the isolative layer 106 between the conductive material 1051 and the seed layer 104 can also be removed while the isolative layer 106 located above the predetermined area is removed. A slot (not shown) may be formed between the conductive material 1051 and a portion of the seed layer 104 near the surface of the planar coil 110.

By the present invention, additives are not needed in the conductive material for reducing deposition on the surface of the planar coil which may cause high resistance. Moreover, since the isolative layer 106 guides the conductive material 1051 to flow into a lower portion of the trench 102 such that accumulation of the conductive material 1051 at opening of the trench 102 is prevented before the lower portion of the trench 102 is completely filled up, the conductive material 1051 is unlikely to overflow from the trench 102, and therefore, a flattening process such as chemical mechanical polishing (CMP) process is not needed.

While the invention has been described in terms of what is presently considered to be the most practical and preferred embodiment, it is to be understood that the invention needs not be limited to the disclosed embodiment. On the contrary, it is intended to cover various modifications and similar arrangements included within the spirit and scope of the appended claims, which are to be accorded with the broadest interpretation so as to encompass all such modifications and similar structures.

What is claimed is:

1. A method for making a planar coil, comprising the steps of:
   a) providing a substrate;
   b) covering a predetermined area of the substrate with a patterned photoresist layer;

c) etching the substrate to form a trench at a place outside of the predetermined area;
d) removing the photoresist layer;
e) applying a barrier on the substrate;
f) growing a seed layer on the barrier;
g) covering the predetermined area with an isolative layer which extends slightly into the trench;
h) filling up the trench with a conductive material by electroplating; and
i) removing a portion of the isolative layer and the seed layer located above the predetermined area;
wherein the isolative layer guides the conductive material to flow into a lower portion of the trench such that accumulation of the conductive material at opening of the trench is prevented before the lower portion of the trench is completely filled up, thereby avoiding gap formation in the trench.

2. The method according to claim 1, wherein step c) is performed by deep reactive-ion etching (DRIE).

3. The method according to claim 1, wherein step d) is conducted by use of acetone.

4. The method according to claim 1, wherein step i) is conducted by use of buffered oxide etch (BOE) for removing the isolative layer, and hydrogen peroxide, ammonium hydroxide, or an acetic acid based etchant is used for removing the seed layer.

5. The method according to claim 1, wherein the seed layer is formed by sputtering.

6. The method according to claim 1, wherein the substrate is made of silicon.

7. The method according to claim 1, wherein the barrier is electrically insulated.

8. The method according to claim 7, wherein the barrier is made of silicon dioxide.

9. The method according to claim 1, wherein the seed layer is made of copper, titanium, or a mixture thereof.

10. The method according to claim 1, wherein the isolative layer is made of silicon dioxide.

11. The method according to claim 1, wherein step g) is performed by plasma-enhanced chemical vapor deposition (PECVD).

12. The method according to claim 1, wherein the conductive material is copper.

13. The method according to claim 1, further comprising a step of j) forming a hole through center of the substrate to form a loop-shaped planar coil.

* * * * *